United States Patent
Happ et al.

(10) Patent No.: US 7,460,394 B2
(45) Date of Patent: Dec. 2, 2008

(54) PHASE CHANGE MEMORY HAVING TEMPERATURE BUDGET SENSOR

(75) Inventors: Thomas Happ, Tarrytown, NY (US); Jan Boris Philipp, Peekskill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/436,358

(22) Filed: May 18, 2006

(65) Prior Publication Data

US 2007/0280023 A1    Dec. 6, 2007

(51) Int. Cl.
   *G11C 11/00* (2006.01)
(52) U.S. Cl. ............. 365/163; 365/189.07; 365/189.06; 365/211; 365/113; 365/148
(58) Field of Classification Search ............ 365/189.07, 365/189.06, 163, 211, 113, 148
See application file for complete search history.

(56) References Cited

U.S. PATENT DOCUMENTS

| | | | | |
|---|---|---|---|---|
| 3,975,951 | A * | 8/1976 | Kohama et al. | 73/118.2 |
| 5,784,328 | A * | 7/1998 | Irrinki et al. | 365/222 |
| 6,625,054 | B2 * | 9/2003 | Lowrey et al. | 365/148 |
| 6,636,937 | B2 | 10/2003 | Peter | |
| 6,768,665 | B2 | 7/2004 | Parkinson et al. | |
| 7,020,014 | B2 * | 3/2006 | Khouri et al. | 365/163 |
| 7,027,343 | B2 * | 4/2006 | Sinha et al. | 365/222 |
| 7,177,218 | B2 * | 2/2007 | Choi et al. | 365/211 |
| 2004/0022085 | A1 | 2/2004 | Parkinson et al. | |
| 2004/0151023 | A1 | 8/2004 | Khourl | |
| 2006/0261879 | A1 * | 11/2006 | Willis | 327/512 |
| 2007/0253238 | A1 * | 11/2007 | Resta et al. | 365/148 |

FOREIGN PATENT DOCUMENTS

| | | |
|---|---|---|
| DE | 10040890 C1 | 1/2002 |
| DE | 102005001668 A1 | 3/2006 |
| EP | 1420412 A1 | 5/2004 |
| EP | 1460637 A1 | 9/2004 |
| EP | 1717817 A1 | 2/2006 |
| JP | 2000011670 | 1/2000 |
| WO | 2004013862 A2 | 2/2004 |
| WO | 2004013862 A3 | 2/2004 |

OTHER PUBLICATIONS

Stefan Lai et al., OUM—A 180nm Nonvolatile Memory Cell Element Technology For Stand Alone and Embedded Applications, International Electron Devices Meeting Technical Digest, Washington D.C., USA, Dec. 2-5, 2001.*

(Continued)

*Primary Examiner*—Amir Zarabian
*Assistant Examiner*—Fernando N Hidalgo
(74) *Attorney, Agent, or Firm*—Dicke, Billig & Czaja, PLLC

(57) ABSTRACT

A semiconductor device includes a plurality of memory cells, a temperature budget sensor, and a circuit. The circuit periodically compares a signal from the temperature budget sensor to a reference signal and refreshes the memory cells based on the comparison.

25 Claims, 2 Drawing Sheets

OTHER PUBLICATIONS

Itrl, A. et al., "Analysis Of Phase-Transformation Dynamics And Estimation Of Amorphous-Chalcogenide Fraction In Phase-Change Memories," 7 pgs. IRPS, 2004.

Redaelli, A. et al., "Impact Of Crystallization Statistics On Data Retention For Phase Change Memories," 4 pgs. IEDM, 2005.

Cho, S.L. et al., "Highly Scalable On-Axis Confined Cell Structure For High Density PRAM Beyond 256 Mb," 2 pgs., VLSI, 2005.

Lai, S. et al., "OUM-A 180nm Nonvolatile Memory Cell Element Technology For Stand Alone And Embedded Applications," 4 pgs., IEDM 2001.

Lai, S. et al., "Current Status Of The Phase Change Memory And Its Future," pp. 10.1.1-10.1.4, IEDM 2003.

Hori, H. et al., A Novel Cell Technology Using N-doped GeSb Te Films For Phase Change RAM.

* cited by examiner

PHASE CHANGE MEMORY HAVING TEMPERATURE BUDGET SENSOR

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material in the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase change materials may be induced reversibly. In this way, the memory may change from the amorphous state to the crystalline state and from the crystalline state to the amorphous state, in response to temperature changes. The temperature changes to the phase change material may be achieved in a variety of ways. For example, a laser can be directed to the phase change material, current may be driven through the phase change material, or current can be fed through a resistive heater adjacent the phase change material. In any of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

The data retention performance of a phase change memory depends strongly upon the temperature history of the memory. Typically, for nonvolatile memory, data retention is guaranteed for at least ten years for operating temperatures up to 85° C. The data retention guarantee is mostly a material property and strongly depends on the crystallization temperature of the phase change material used. For example, for $Ge_2Sb_2Te_5$, the real retention performance is about ten years for operating temperatures up to 95° C. to 110° C. For many applications, however, this temperature specification is not sufficient. For example, in automotive applications this temperature may be exceeded. In addition, a memory device is not typically operated at a constant ambient temperature, but rather experiences significant changes in the ambient temperature. For example, a memory device for an engine controller of a car will experience extremes in temperatures based on whether the engine is running. In this case, the data retention of the memory device is not so strongly impacted by momentary temperatures (within certain limits) or an average temperature, but rather by the temperature budget accumulated by the memory device.

For these and other reasons, there is a need for the present invention.

SUMMARY

One embodiment of the present invention provides a semiconductor device. The semiconductor device includes a plurality of memory cells, a temperature budget sensor, and a circuit. The circuit periodically compares a signal from the temperature budget sensor to a reference signal and refreshes the memory cells based on the comparison.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
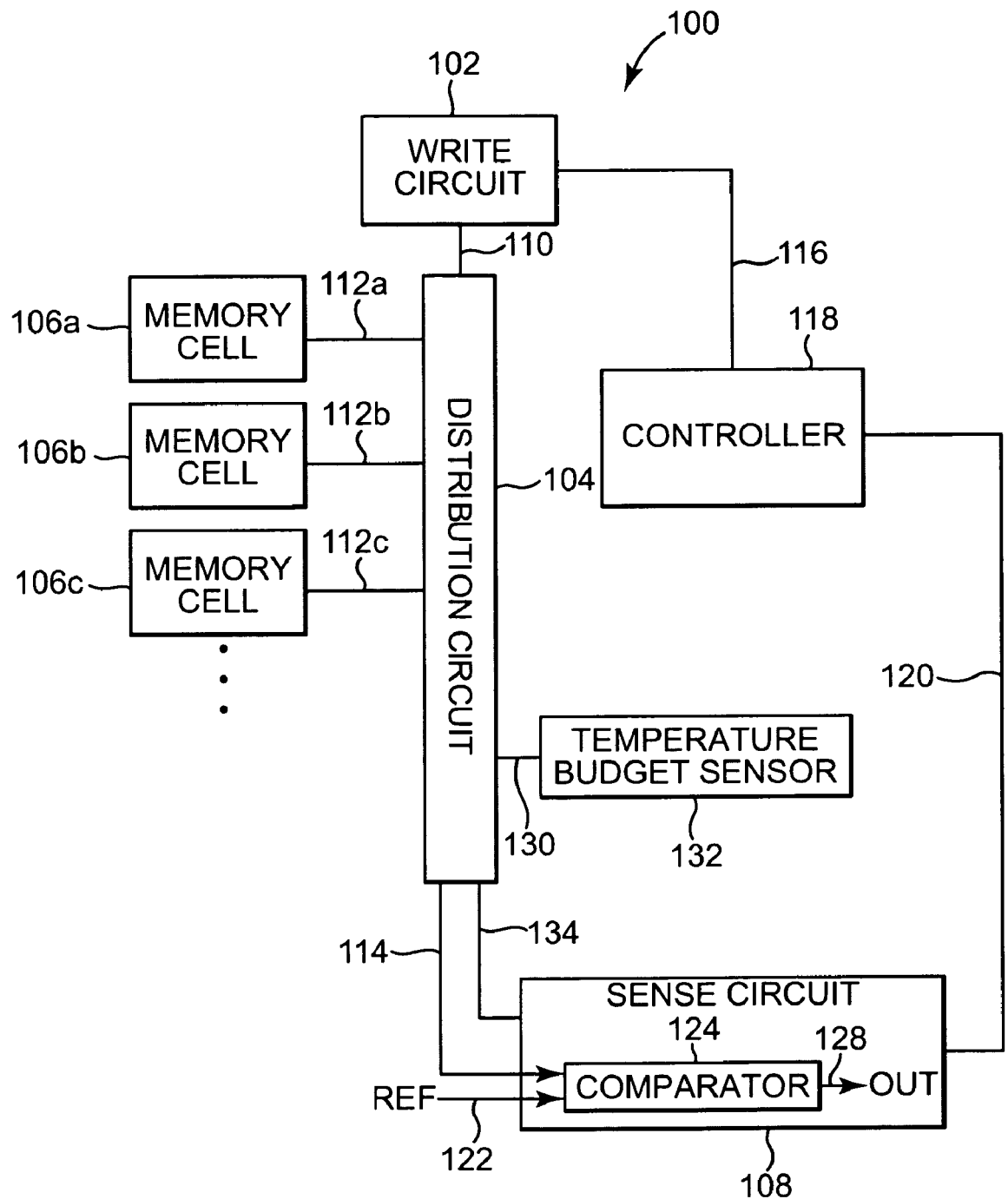
FIG. 1 is a block diagram illustrating one embodiment of a memory device.

FIG. 1 is a block diagram illustrating one embodiment of a memory device 100. Memory device 100 includes a write circuit 102, a distribution circuit 104, memory cells 106a, 106b, and 106c, a temperature budget sensor 132, a controller 118, and a sense circuit 108. Sense circuit 108 includes a comparator 124. In one embodiment, each of the memory cells 106a-106c is a phase change memory cell that stores data based on the amorphous and crystalline states of phase change material in the memory cell. In other embodiments, each of the memory cells 106a-106c is another type of resistive memory cell or a flash memory cell.

Temperature budget sensor 132 enables memory device 100 to be operated at temperatures beyond the limits of long term data retention in the phase change material used. Temperature budget sensor 132 monitors the temperature budget of memory device 100 with memory device 100 powered on and operating or with memory device 100 powered off. A simple thermometer would be insufficient for monitoring the temperature budget of memory device 100 since a thermometer would only be active with memory device 100 powered on.

The temperature budget (TB) relevant for data retention in a phase change memory is defined as follows:

$$TB = \int \alpha(T) T(t) dt \qquad \text{Equation I}$$

Where:
α(T)=sensitivity factor;
T=temperature; and
t=time.

The sensitivity factor α(T) scales to approximately the inverse of the retention time ($t_{ret}^{-1}$). Once the temperature budget of memory device 100 exceeds a maximum allowed value, the data stored in memory cells 106a-106c in memory device 100 is jeopardized. If the temperature budget of memory device 100 is exceeded or close to being exceeded, the data stored in memory cells 106a-106c is refreshed to maintain their values.

As used herein, the term "electrically coupled" is not meant to mean that the elements must be directly coupled together and intervening elements may be provided between the "electrically coupled" elements.

Write circuit 102 is electrically coupled to distribution circuit 104 through signal path 110. Distribution circuit 104 is electrically coupled to each of the memory cells 106a-106c through signal paths 112a-112c. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. In addition, distribution circuit 104 is electrically coupled to temperature budget sensor 132 through signal path 130, sense circuit 108 through signal path 134, and to a first input of comparator 124 through signal path 114. A second input of comparator 124 receives a reference (REF) signal on REF signal path 122. The output of comparator 124 provides an output (OUT) signal on OUT signal path 128. Sense circuit 108 is electrically coupled to controller 118 through signal path 120. Controller 118 is electrically coupled to write circuit 102 through signal path 116.

Each of the memory cells 106a-106c includes a phase change material that may be changed from an amorphous state to a crystalline state or from a crystalline state to an amorphous state under the influence of temperature change. The degree of crystallinity thereby defines at least two memory states for storing data within memory device 100. The at least two memory states can be assigned to the bit values "0" and "1". The bit states of memory cells 106a-106c differ significantly in their electrical resistivity. In the amorphous state, a phase change material exhibits significantly higher resistivity than in the crystalline state.

The phase change material of memory cells 106a-106c may be made up of a variety of materials in accordance with the present invention. Generally, chalcogenide alloys that contain one or more elements from group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Temperature budget sensor 132 is set to an initial state and senses the total temperature budget of memory device 100. Once the temperature budget of memory device 100 exceeds a specified threshold value, all memory cells 106a-106c within memory device 100 are refreshed. At the same time memory cells 106a-106c are refreshed, temperature budget sensor 132 is reset to its initial state. The state of temperature budget sensor 132 is sensed periodically. For example, the state of temperature budget sensor 132 can be sensed at every power up, once a day, once an hour, once a minute, combinations thereof, or at any other suitable interval. The interval selected is based on the application and the expected temperatures to which memory device 100 will be exposed.

Temperature budget sensor 132 includes a phase change memory cell. In one embodiment, the phase change memory cell for temperature budget sensor 132 is fabricated with memory cells 106a-106c. In another embodiment, the phase change memory cell for temperature budget sensor 132 is fabricated separately from memory cells 106a-106c, but is fabricated using similar processes as used to fabricate memory cells 106a-106c.

The phase change memory cell of temperature budget sensor 132 is specifically weakly reset or weakly set to initialize temperature budget sensor 132 to an intermediate resistance state between fully reset and fully set. The intermediate resistance state is particularly prone to temperature induced crystallization and therefore resistance loss, since the phase change material in this intermediate resistance state consists of an amorphous matrix with lots of crystalline seeds. Hence, the resistance of temperature budget sensor 132 is guaranteed to be reduced faster than the resistance of a fully reset phase change memory cell when exposed to higher temperatures.

Operation of temperature budget sensor 132 is guaranteed even without power to memory device 100, since temperature budget sensor 132 passively records the accumulated crystallization. At the next power up of memory device 100, temperature budget sensor 132 is read to determine whether memory cells 106a-106c should be refreshed.

In another embodiment, where memory cells 106a-106c are flash memory cells, temperature budget sensor 132 is a flash memory cell. In this embodiment, temperature budget sensor 132 is weakly written to a different threshold voltage and monitored in a similar manner as described above. Temperature budget sensor 132 is read periodically to determine whether memory cells 106a-106c should be refreshed.

Controller 118 controls the operation of write circuit 102 and sense circuit 108. Controller 118 includes a microprocessor, microcontroller, or other suitable logic circuitry for controlling the operation of write circuit 102 and sense circuit 108. Controller 118 controls write circuit 102 for setting the resistance states of memory cells 106a-106c. Controller 118 controls sense circuit 108 for reading the resistance states of memory cells 106a-106c. Controller 118 also controls sense circuit 108 for reading the resistance state of temperature budget sensor 132. Based on the resistance state of temperature budget sensor 132, controller 118 refreshes memory cells 106a-106c.

Write circuit 102 provides pulses to memory cells 106a-106c and programs the resistance levels or states into the phase change material of each of the memory cells 106a-106c. In one embodiment, write circuit 102 provides voltage pulses to distribution circuit 104 through signal path 110, and distribution circuit 104 controllably directs the voltage pulses to memory cells 106a-106c through signal paths 112a-112c. In one embodiment, distribution circuit 104 includes a plurality of transistors that controllably direct voltage pulses to each of the memory cells 106a-106c. In other embodiments, write circuit 102 provides current pulses to distribution circuit 104 through signal path 110, and distribution circuit 104 controllably directs the current pulses to memory cells 106a-106c through signal paths 112a-112c.

Write circuit 102 also provides pulses to temperature budget sensor 132 to set temperature budget sensor 132 to its initial resistance state. In one embodiment, write circuit 102 provides voltage pulses to distribution circuit 104 through signal path 110, and distribution circuit 104 controllably directs the voltage pulses to temperature budget sensor 132 through signal path 130. In one embodiment, distribution circuit 104 includes a plurality of transistors that controllably direct voltage pulses to temperatures budget sensor 132. In other embodiments, write circuit 102 provides current pulses to distribution circuit 104 through signal path 110, and distribution circuit 104 controllably directs the current pulses to temperature budget sensor 132 through signal path 130.

Sense circuit 108 senses the state of the phase change material and provides signals that indicate the state of the phase change material in memory cells 106a-106c. Sense circuit 108 reads each of the states of memory cells 106a-106c through signal path 134. Distribution circuit 104 controllably directs read signals between sense circuit 108 and memory cells 106a-106c through signal paths 112a-112c. In one embodiment, distribution circuit 104 includes a plurality of transistors that controllably direct read signals between sense circuit 108 and memory cells 106a-106c.

Sense circuit 108 also senses the state of temperature budget sensor 132 and provides a signal that indicates the state of the phase change material of temperature budget sensor 132. In one embodiment, sense circuit 108 reads the state of temperature budget sensor 132 through signal path 114. In another embodiment, sense circuit 108 reads the state of temperature budget sensor 132 through signal path 134 and passes the signal to signal path 114. Distribution circuit 104 controllably directs a read signal between sense circuit 108 and temperature budget sensor 132 through signal path 130. In one embodiment, distribution circuit 104 includes a plurality of transistors that controllably direct the read signal between sense circuit 108 and temperature budget sensor 132.

Comparator 124 compares the resistance of temperature budget sensor 132 to a reference resistance. Comparator 124 receives a read signal from temperature budget sensor 132 through distribution circuit 104 on signal path 114 and a reference signal on REF signal path 122 to provide the OUT signal on OUT signal path 128. In one embodiment, the reference signal is selected such that a voltage applied across temperature budget sensor 132 generates a current read signal greater than the reference signal to indicate that memory cells 106a-106c should be refreshed. In another embodiment, the reference signal is selected such that a current applied to temperature budget sensor 132 generates a voltage read signal less than the reference signal to indicate that memory cells 106a-106c should be refreshed. In one embodiment, the reference signal is adjusted based on a current temperature of memory device 100 using a band gap reference or other suitable circuit.

In one embodiment, the read signal on signal path 114 is a current signal providing an indication of the resistance state of temperature budget sensor 132 and the reference signal on REF signal path 122 is a current signal. In another embodiment, the read signal on signal path 114 is a voltage signal providing an indication of the resistance state of temperature budget sensor 132 and the reference signal on REF signal path 122 is a voltage signal. In any case, in response to the resistance of temperature budget sensor 132 indicated by the read signal on signal path 114 being less than the reference resistance as indicated by the reference signal on REF signal path 122, comparator 124 outputs a logic high OUT signal on OUT signal path 128. In response to the resistance of temperature budget sensor 132 indicated by the read signal on signal path 114 being greater than the reference resistance as indicated by the reference signal on REF signal path 122, comparator 124 outputs a logic low OUT signal on OUT signal path 128.

In response to a logic high OUT signal, controller 118 controls write circuit 102 to refresh memory cells 106a-106c. In response to a logic low OUT signal, controller 118 does not refresh memory cells 106a-106c and normal operations continue. Sense circuit 108 periodically senses the state of temperature budget sensor 132 and controller 118 refreshes memory cells 106a-106c once the OUT signal transitions to logic high.

To program a memory cell 106a-106c within memory device 100, write pulse generator 102 generates a current or voltage pulse for heating the phase change material in the target memory cell. In one embodiment, write pulse generator 102 generates an appropriate current or voltage pulse, which is fed into distribution circuit 104 and distributed to the appropriate target memory cell 106a-106c. The current or voltage pulse amplitude and duration is controlled depending on whether the memory cell is being set or reset. Generally, a "set" operation of a memory cell is heating the phase change material of the target memory cell above its crystallization temperature (but below its melting temperature) long enough to achieve the crystalline state. Generally, a "reset" operation of a memory cell is heating the phase change material of the target memory cell above its melting temperature, and then quickly quench cooling the material, thereby achieving the amorphous state. Memory cells 106a-106c are refreshed to maintain their programmed values based on the total temperature budget of memory device 100 as sensed by temperature budget sensor 132. In another embodiment, phase change switches and/or fuses (not shown) can be refreshed to maintain their programmed states based on the total temperature budget as sensed by temperature budget sensor 132.

Figure 2:
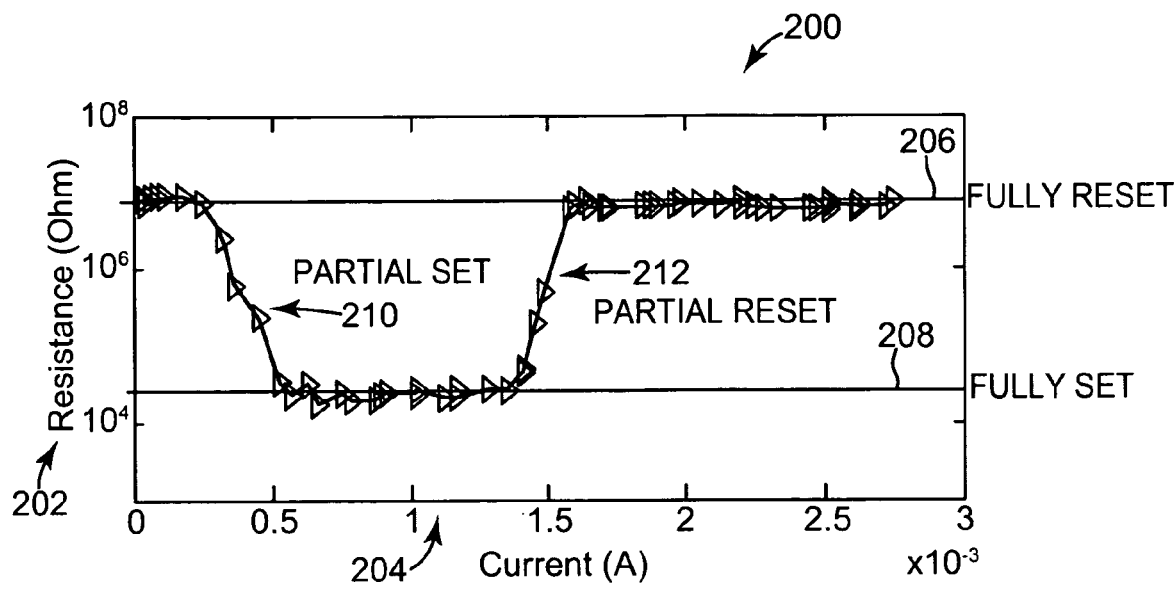
FIG. 2 is a chart illustrating one embodiment of resistance states of a phase change memory cell.

FIG. 2 is a chart 200 illustrating one embodiment of resistance states of a phase change memory cell, such as the phase change memory cell used in temperature budget sensor 132. Chart 200 includes the current in amps applied to the phase change memory cell on x-axis 204 versus the resistance in ohms of the phase change memory cell on y-axis 202 after applying the specified current. Starting from a fully reset phase change memory cell as indicated at 206, a current between approximately 0A and $0.3 \times 10^{-3}$ A does not change the resistance state of the phase change memory cell from the fully reset state. A current between approximately $0.3 \times 10^{-3}$ A and $0.5 \times 10^{-3}$ A changes the resistance state of the phase change memory cell to a partially set state as indicated at 210. A current between approximately $0.5 \times 10^{-3}$ A and $1.4 \times 10^{-3}$ A changes the resistance state of the phase change memory cell to a fully set state as indicated at 208. A current between approximately $1.4 \times 10^{-3}$ A and $1.6 \times 10^{-3}$ A changes the resistance state of the phase change memory cell to a partially reset state as indicated at 212. A current greater than approximately $1.6 \times 10^{-3}$ A changes the resistance state of the phase change memory cell back to the fully reset state as indicated at 206. The specific current ranges for obtaining the partially set, fully set, partially reset, and fully reset states will vary based on the phase change material used, the memory cell concept used, and the memory cell dimensions used.

The sensitivity of temperature budget sensor 132 is adjusted by the programming conditions (i.e., starting resistance) of temperature budget sensor 132. The initial state of the phase change material of temperature budget sensor 132 is adjusted using one of two methods. In the first method, the phase change material of temperature budget sensor 132 is fully reset as indicated at 206 and then slightly set as indicated at 210 until the desired resistance level is achieved. In the second method, a substandard reset pulse is applied to the phase change material of temperature budget sensor 132 to partially reset the phase change material as indicated at 212 to achieve the desired resistance level.

Figure 3:
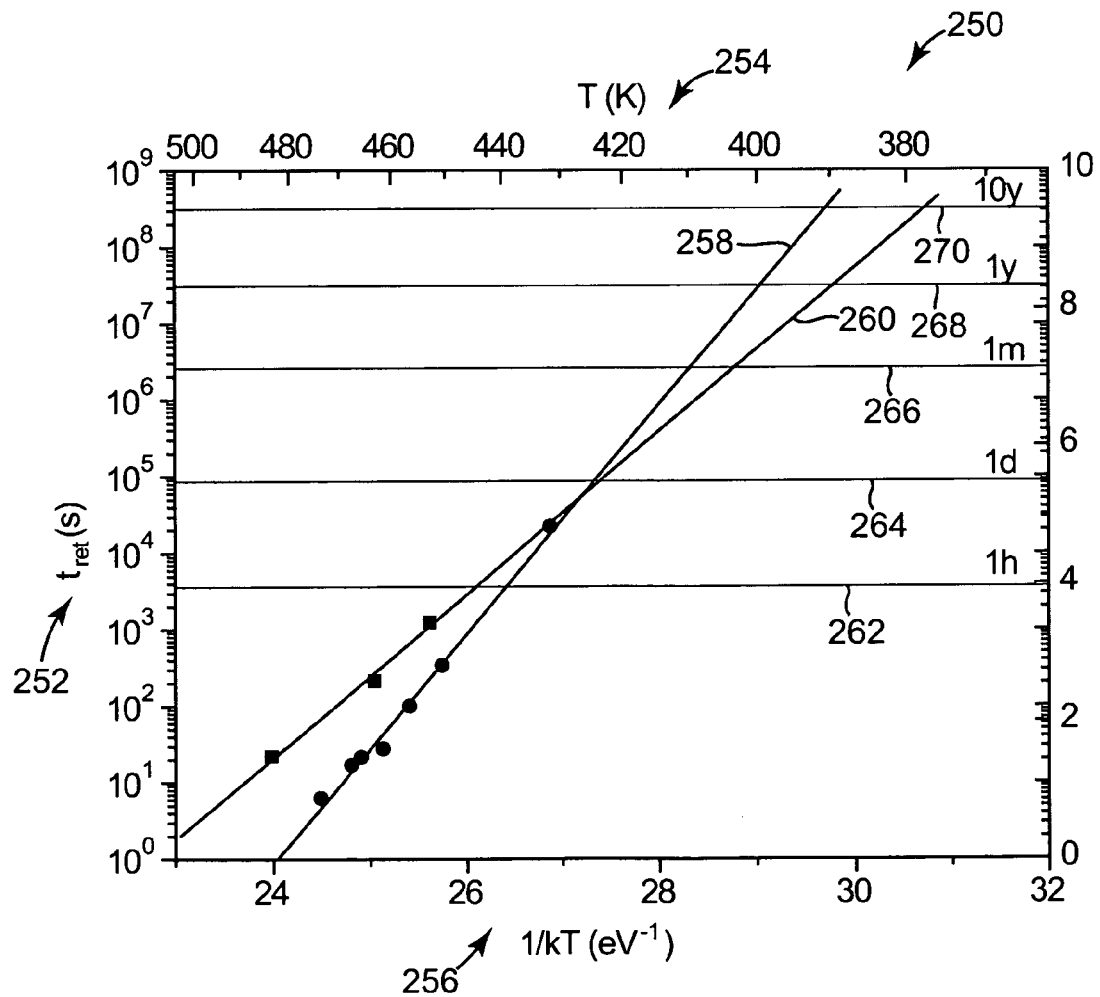
FIG. 3 is a chart illustrating one embodiment of retention time versus temperature for two phase change materials.

FIG. 3 is a chart 250 illustrating one embodiment of retention time versus temperature for two phase change materials. Chart 250 includes temperature (T) in K on x-axis 254 and in $1/kT$ ($eV^{-1}$) on x-axis 256 and retention time ($t_{ret}$) in seconds on Y-axis 252. Line 258 illustrates the retention time versus temperature for GST and line 260 illustrates the retention time versus temperature for GST doped with N. As illustrated by chart 250, the typical specification of 105° C. for 10 year data retention of memory device 100 is indicated at 270. Memory device 100 can be operated at a temperature of approximately 120° C. if memory cells 106a-106c of memory device 100 are refreshed once a year as indicated at 268. Memory device 100 can be operated at a temperature of approximately 130° C. if memory cells 106a-106c of memory device 100 are refreshed once a month as indicated at 266. Memory device 100 can be operated at a temperature of approximately 150° C. if memory cells 106a-106c of memory device 100 are refreshed once a day as indicated at 264. Memory device 100 can be operated at a temperature of approximately 170° C. if memory cells 106a-106c of memory device 100 are refreshed once an hour as indicated at 262. As the refresh period is shortened, the temperature memory device 100 can withstand increases.

Temperature budget sensor 132 senses the total temperature budget experienced by memory device 100 and memory device 100 is refreshed if the temperature budget is exceeded. Refreshing memory device 100 when the temperature budget is exceeded prevents unnecessary refreshes of memory device 100 at specified intervals as described above while expanding the temperature range in which memory device 100 can operate.

Embodiments of the present invention provide a temperature budget sensor for monitoring the total temperature budget to which a memory device has been exposed. The temperature budget sensor monitors the temperature budget to which the memory device has been exposed with the memory device powered on or off. Once a safe level for the temperature budget of the memory device is exceeded, the memory cells of the memory device are refreshed to maintain their values.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A resistive memory device comprising:
a plurality of resistive memory cells; and
a temperature budget sensor for detecting a temperature budget based on an integration of a temperature of the resistive memory device over time, the temperature budget sensor comprising a phase change material and adapted to be initialized by slightly setting the phase change material.

2. The device of claim 1, wherein the memory cells comprise phase change memory cells.

3. The device of claim 1, wherein the temperature budget sensor comprises a phase change memory cell.

4. The device of claim 1, wherein the temperature budget sensor monitors a temperature budget of the device with the device powered down.

5. A memory comprising:
an array of phase change memory cells;
a temperature budget sensor for detecting a temperature budget based on an integration of a temperature of the array over time, the temperature budget sensor including a phase change material in a partially crystalline and partially amorphous state and adapted to be initialized by slightly setting the phase change material; and
a circuit for periodically comparing a signal from the phase change material of the temperature budget sensor to a reference signal and refreshing the array of phase change memory cells based on the comparison.

6. The memory of claim 5, wherein the partially crystalline and partially amorphous state comprises a partially reset state.

7. The memory of claim 5, wherein the partially crystalline and partially amorphous state comprises a partially set state.

8. The memory of claim 5, wherein the temperature budget sensor comprises a phase change memory cell within the array of phase change memory cells.

9. The memory of claim 5, wherein the circuit comprises a comparator for comparing a current signal through the phase change material of the temperature budget sensor to a reference current.

10. The memory of claim 5, wherein the reference signal is adjusted based on a current temperature of the memory.

11. The memory of claim 5, wherein the circuit comprises a comparator for comparing a voltage across the phase change material of the temperature budget sensor to a reference voltage.

12. A memory device comprising:
an array of phase change memory cells;
means for monitoring a temperature budget of the array of memory cells based on an integration of a temperature of the array over time, the means for monitoring comprising a phase change material;
means for initializing the means for monitoring by slightly setting the phase change material; and
means for refreshing the array of memory cells in response to the temperature budget exceeding a predefined threshold.

13. The memory device of claim 12, wherein the means for monitoring the temperature budget comprises means for monitoring the temperature budget with the memory device powered off.

14. A method for operating a resistive memory, the method comprising:
resetting a phase change material of a temperature budget sensor;

slightly setting the phase change material of the temperature budget sensor to initialize the temperature budget sensor; and monitoring, by the temperature budget sensor, a temperature budget of the resistive memory based on an integration of a temperature of the resistive memory over time.

15. The method of claim 14, wherein monitoring the temperature budget comprises monitoring the temperature budget with the memory powered off.

16. The method of claim 14, wherein monitoring the temperature budget comprises monitoring a temperature budget of a phase change memory.

17. A method for operating a memory, the method comprising:
    setting a phase change memory cell to a partially crystalline and partially amorphous state;
    periodically comparing a signal from the memory cell to a reference signal, the signal from the memory cell indicating a temperature budget of the memory based on an integration of a temperature of the memory over time; and
    refreshing a plurality of phase change memory cells storing data in response to the comparison,
    wherein setting the phase change memory cell to the partially crystalline and partially amorphous state comprises fully resetting the memory cell and then slightly setting the memory cell.

18. The method of claim 17, wherein refreshing the plurality of memory cells storing data in response to the comparison comprises refreshing the plurality of memory cells in response to the signal from the memory cell exceeding the reference signal.

19. The method of claim 17, wherein periodically comparing the signal from the memory cell to the reference signal comprises periodically comparing a current through the memory cell to a reference current.

20. The method of claim 17, wherein periodically comparing the signal from the memory cell to the reference signal comprises periodically comparing a voltage across the memory cell to a reference voltage.

21. A method for operating a memory, the method comprising:
    setting a phase change memory cell to a partially crystalline and partially amorphous state;
    periodically comparing a signal from the memory cell to a reference signal, the signal from the memory cell indicating a temperature budget of the memory based on an integration of a temperature of the memory over time; and
    refreshing a plurality of phase change memory cells storing data in response to the comparison,
    wherein setting the phase change memory cell to the partially crystalline and partially amorphous state comprises partially resetting the memory cell.

22. A resistive memory device comprising:
    a plurality of resistive memory cells;
    a temperature budget sensor for detecting a temperature budget based on an integration of a temperature of the resistive memory device over time, the temperature budget sensor comprising a phase change material and adapted to be initialized by slightly setting the phase change material; and
    a circuit for periodically comparing a signal from the temperature budget sensor to a reference signal and refreshing the resistive memory cells based on the comparison.

23. The device of claim 22, wherein the circuit comprises a comparator for comparing a current through the temperature budget sensor to a reference current.

24. The device of claim 22, wherein the reference signal is adjusted based on a current temperature of the device.

25. The device of claim 22, wherein the circuit comprises a comparator for comparing a voltage across the temperature budget sensor to a reference voltage.

* * * * *